(12) United States Patent
Suzuki

(10) Patent No.: US 6,666,560 B2
(45) Date of Patent: Dec. 23, 2003

(54) REFLECTION TYPE DEMAGNIFICATION OPTICAL SYSTEM, EXPOSURE APPARATUS, AND DEVICE FABRICATING METHOD

(75) Inventor: Masayuki Suzuki, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 30 days.

(21) Appl. No.: 10/136,722

(22) Filed: Apr. 30, 2002

(65) Prior Publication Data

US 2003/0039029 A1 Feb. 27, 2003

(30) Foreign Application Priority Data

May 1, 2001 (JP) .......................... 2001-133809

(51) Int. Cl.[7] ................................. G02B 5/10
(52) U.S. Cl. ...................... 359/859; 359/861; 355/67
(58) Field of Search ..................... 359/727, 728, 359/729, 730, 731, 857, 858, 859, 861; 355/67

(56) References Cited

U.S. PATENT DOCUMENTS

| 6,072,852 A | 6/2000 | Hudyma | 378/34 |
| 6,172,852 B1 | 1/2001 | Boutaghou et al. | 360/244.5 |
| 6,213,610 B1 | 4/2001 | Takahashi et al. | 359/858 |
| 6,353,470 B1 * | 3/2002 | Dinger | 355/71 |
| 6,361,176 B1 * | 3/2002 | Mashima | 359/857 |

FOREIGN PATENT DOCUMENTS

| JP | 2000-98228 | 4/2000 |
| JP | 2000-100694 | 4/2000 |

* cited by examiner

*Primary Examiner*—Mark A. Robinson
(74) *Attorney, Agent, or Firm*—Morgan & Finnegan

(57) ABSTRACT

A reflection type magnification projection optical system includes five light-reflecting mirrors arranged from an object side to an image side in a sequence of a concave mirror (M1), a convex mirror (M2), a concave mirror (M3), a convex mirror (M4), and a concave mirror (M5) such that those mirrors basically form a coaxial system, and forming no intermediate image, and wherein an object point and an image point are respectively on opposite sides across an optical axis, and the object point and the image point are kept 400~1500 mm apart with respect to a direction orthogonal to the optical axis.

8 Claims, 8 Drawing Sheets

REFLECTION TYPE DEMAGNIFICATION OPTICAL SYSTEM, EXPOSURE APPARATUS, AND DEVICE FABRICATING METHOD

BACKGROUND OF THE INVENTION

The present invention relates generally to exposure apparatuses, and more particularly to a reflection type demagnification projection optical system, an exposure apparatus, and a device fabricating method. The reflection type demagnification projection optical system uses ultraviolet ("UV") and extreme ultraviolet ("EUV") light to project and expose an object such as a single crystal substrate for a semiconductor wafer, and a glass plate for a liquid crystal display (LCD).

Along with the recent demand on smaller and lower profile electronic devices, minute semiconductor devices to be mounted onto these electronic devices have been increasingly demanded. For example, a design rule for a mask pattern requires that an image with a size of a line and space (L&S) of less than 0.1 μm be extensively formed, and predictably, it will further move to a formation of circuit patterns of less than 80 nm in the future. L&S denotes an image projected to a wafer in exposure with equal line and space widths, and serves as an index of exposure resolution.

A projection exposure apparatus, which is a typical exposure apparatus for fabricating semiconductor devices, includes a projection optical system that projects and exposes a pattern drawn on a mask or a reticle (which are used interchangeably in the present application) onto a wafer. Resolution R of a projection exposure apparatus (a minimum size which enables a precise transfer of an image) can be given by using a light-source wavelength λ and the numerical aperture (NA) of the projection optical system as in the following equation:

$$R = k_1 \times \frac{\lambda}{NA} \tag{1}$$

Therefore, the shorter the wavelength becomes, and the higher the NA increases, the better the resolution becomes. In the meantime, a focusing range that maintains a desired image-forming performance is called a depth of focus ("DOF"), and the DOF is given in the following equation.

$$DOF = k_2 \times \frac{\lambda}{NA^2} \tag{2}$$

Therefore, the shorter the wavelength becomes, and the higher the NA increases, the smaller the DOF becomes. A small DOF would make focus adjustment difficult, as well as requiring higher flatness for a substrate and more precise focusing accuracy, and thus, a large DOF is basically desirable.

It can be understood from the equations 1 and 2 that a shortened wavelength is more desirable than an increased NA. In recent years, $F_2$ excimer laser (with a wavelength of 157 nm), UV and EUV (extreme ultraviolet) light have been put to practical use as an exposure light source.

Since a shorter wavelength of light would limit usable glass materials for transmitting the light, use of reflecting elements, i.e., mirrors for a projection optical system are advantageous instead of use of many refracting elements, i.e., lenses. Further, no glass materials are usable for UV or EUV light as exposure light, and thus a projection optical system could not include any lens. Therefore, it has been proposed to form a projection optical system only with mirrors (e.g., multilayer film mirrors). For example, a projection optical system including four mirrors is proposed in Japanese Laid-Open Patent Application No. 2000-98228, while a projection optical system including six mirrors is proposed in Japanese Laid-Open Patent Application No. 2000-100694.

However, the conventional reflection type projection optical system could not reconcile the exposure performance such as resolving power and throughput, thus disadvantageously being unable to provide high quality devices. To be more specific, if it is assumed that a reflection coefficient of one multilayer film mirror is, for example, 67%, a reflection type projection optical system including four mirrors (sometimes expressed as a four-mirror system, hereinafter) can obtain a total reflection coefficient of as much as 20%. Nevertheless, NA can only attain as much as 0.1, and does not improve resolving power. On the other hand, in using a reflection type projection optical system including six mirrors (sometimes expressed as a six-mirror system hereinafter), it may be possible to improve the resolving power since NA can be made larger by as much as 0.15, but the reflection coefficient is altogether about 9%, thus degrading throughput.

On the other hand, a reflection type projection optical system including five mirrors, i.e., an intermediate number of mirrors (sometimes expressed as a five-mirror system, hereinafter) conceivably has balanced resolving power and throughput, and U.S. Pat. No. 6,072,852 discloses a high NA, reflection type demagnification projection optical system as a five-mirror system. However, a design example of optical system in this reference sets a distance between object and image points, opposite to each other with respect to an optical axis, to be about 260 mm in a direction orthogonal to the optical axis of the optical system. Thus, disadvantageously, such a reflection type projection optical system cannot be used for an EUV lithography system that employs a 300 mm silicon wafer and a six-inch reticle, since a mask stage and a wafer stage will mechanically interfere with each other.

BRIEF SUMMARY OF THE INVENTION

Accordingly, it is an exemplary object of the present invention to provide a reflection type demagnification projection optical system, an exposure apparatus, and a device fabricating method, in which the reflection type demagnification projection optical system as a five-mirror system is applicable to an EUV lithography system using a 300 mm silicon wafer and a six-inch reticle, and has balanced resolving power and throughput.

In order to accomplish the above object, the reflection type demagnification projection optical system as one aspect of the present invention has five mirrors including, in order from an object side to an image side a concave mirror (M1), a convex mirror (M2), a concave mirror (M3), a convex mirror (M4), and a concave mirror (M5), these five mirrors basically forming a coaxial system, and forming no intermediate image, and wherein an object point and an image point are respectively on opposite sides across an optical axis, and are kept 400 mm~1500 mm apart from each other with respect to a direction orthogonal to the optical axis. Such a reflection type demagnification projection optical system may widen the distance between the object point and the image point even in the five-mirror system.

At least one of these five mirrors may be an aspheric mirror. Such a five-mirror structure provides a larger object height (image height), thereby avoiding interference between both stages. Furthermore, out of the five mirrors, the fourth convex mirror (M4) may be located at an aperture stop. An adequately set position and shape of the fifth concave mirror (M5) relative to the convex mirror (M4) would create a telecentric optical system on the image side. The five mirrors may multilayer film mirrors for reflecting EUV light, thus being able to efficiently reflect a ray having a wavelength of 20 nm or less. The reflection type demagnification projection optical system may arrange a reflective mask at the object side.

An exposure apparatus as another aspect of the present invention includes the above projection optical system, a first stage for holding the mask so that a mask pattern may be located on the object side, a second stage for holding a substrate so that a photosensitive layer may be located at the image side, an illumination optical system that illuminates the above mask by using arc-shaped EUV light corresponding to an arc-shaped field of the projection optical system, and a mechanism that synchronously scans the first and second stages. Such an exposure apparatus includes the above reflection type demagnification optical system as one element, thereby widening an interval between the object point and the image point, and prevent the first and second stages from mechanically interfering with each other.

A device fabricating method as still another aspect of the present invention includes the steps of using the above exposure apparatus to project and expose the above plate, and performing a specified process on the object projected and exposed as above. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
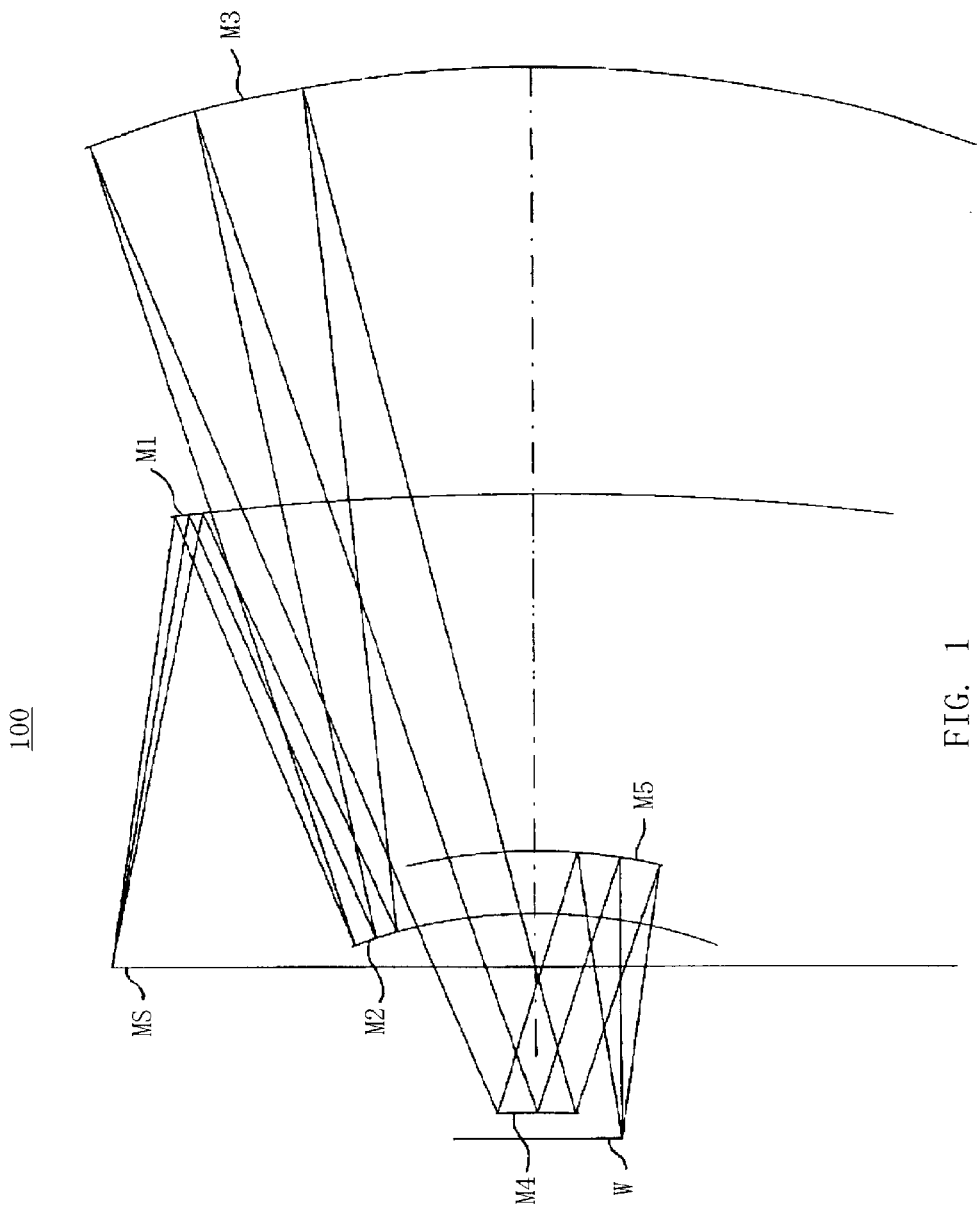
FIG. 1 is a schematic sectional view showing a reflection type demagnification projection optical system as one aspect of the present invention, and its optical path.
Figure 2:
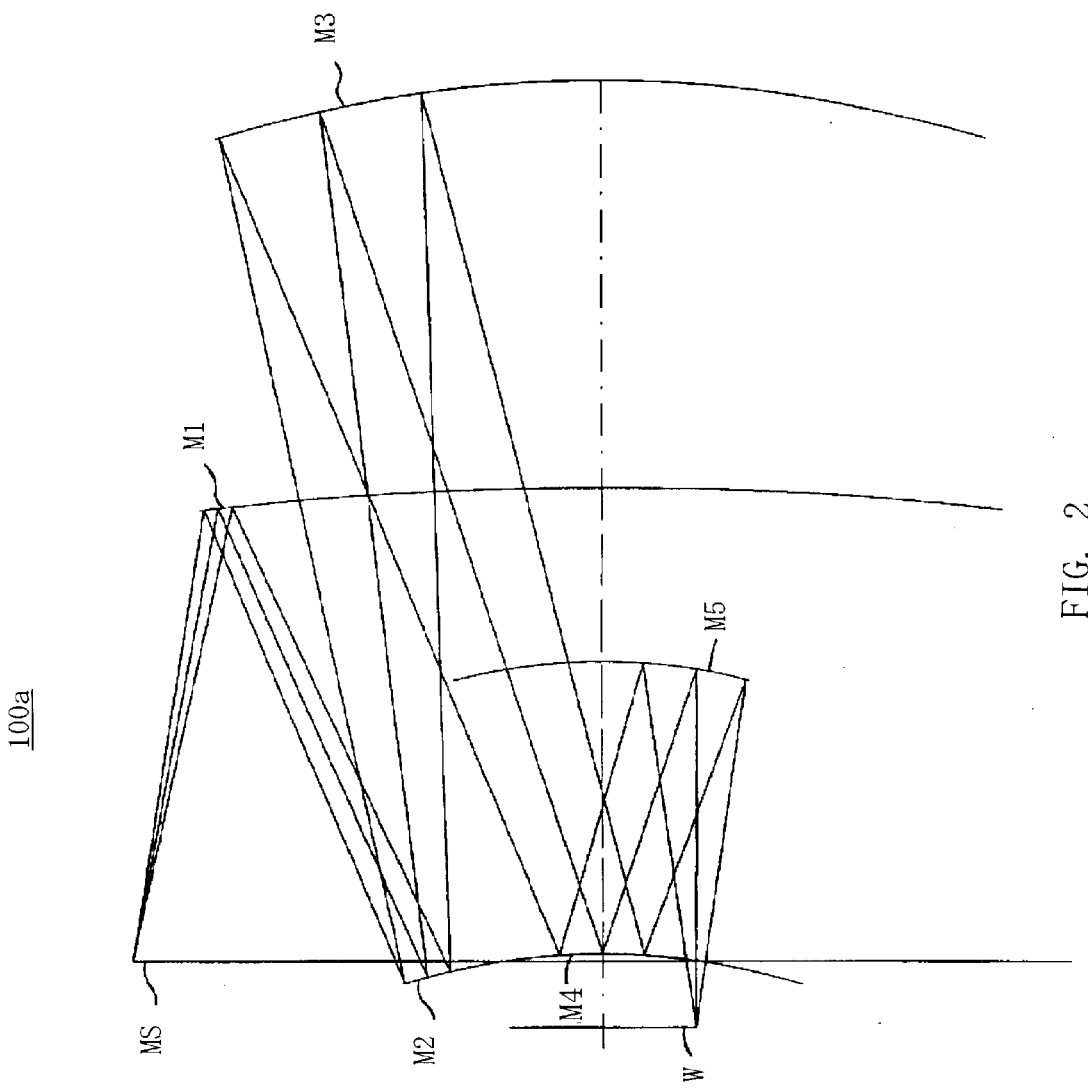
FIG. 2 is a schematic sectional view showing a reflection type demagnification projection optical system different from that shown in FIG. 1, and its optical path.
Figure 3:
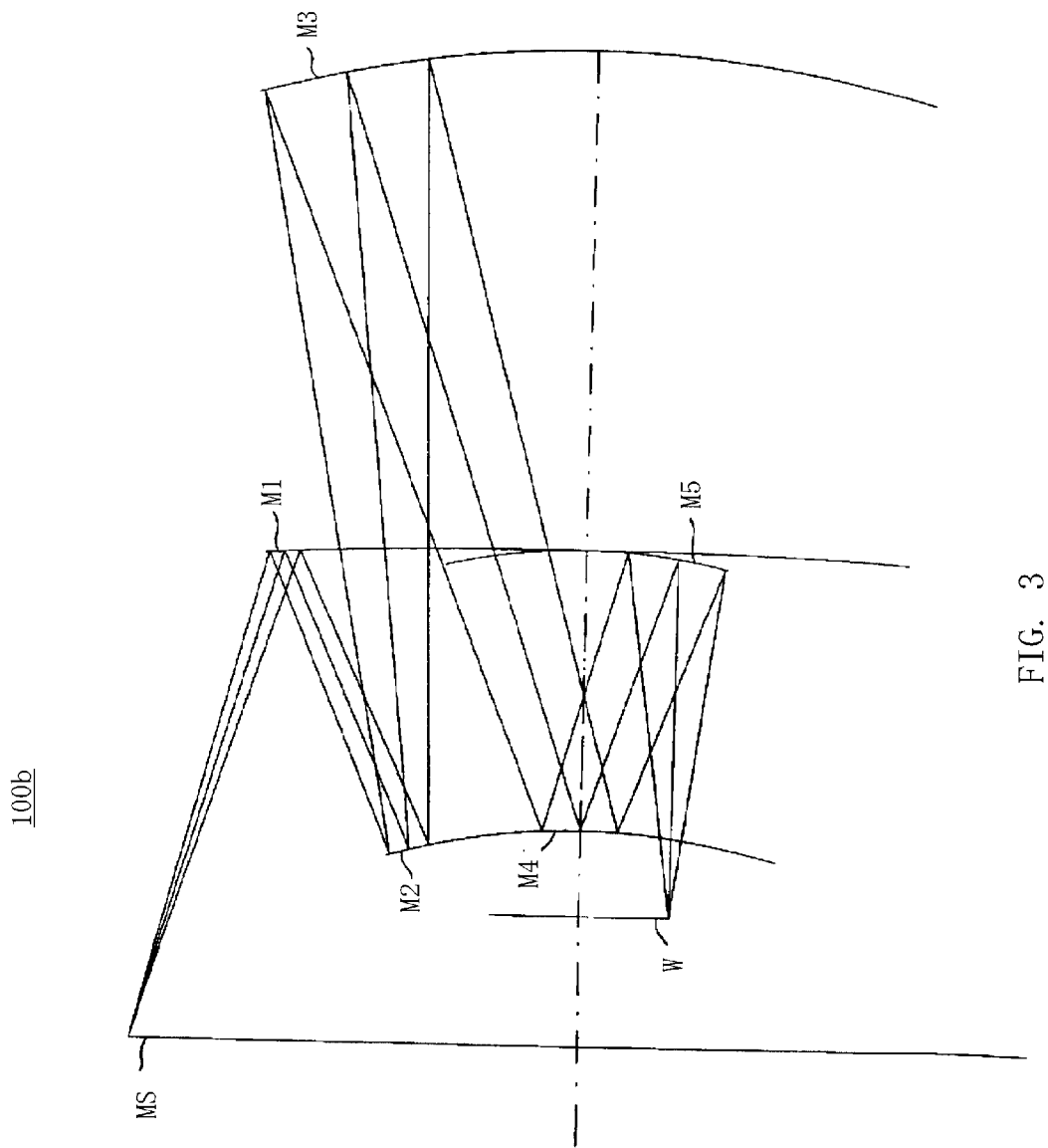
FIG. 3 is a schematic sectional view showing a reflection type demagnification projection optical system different from that shown in FIG. 1, and its optical path.
Figure 4:
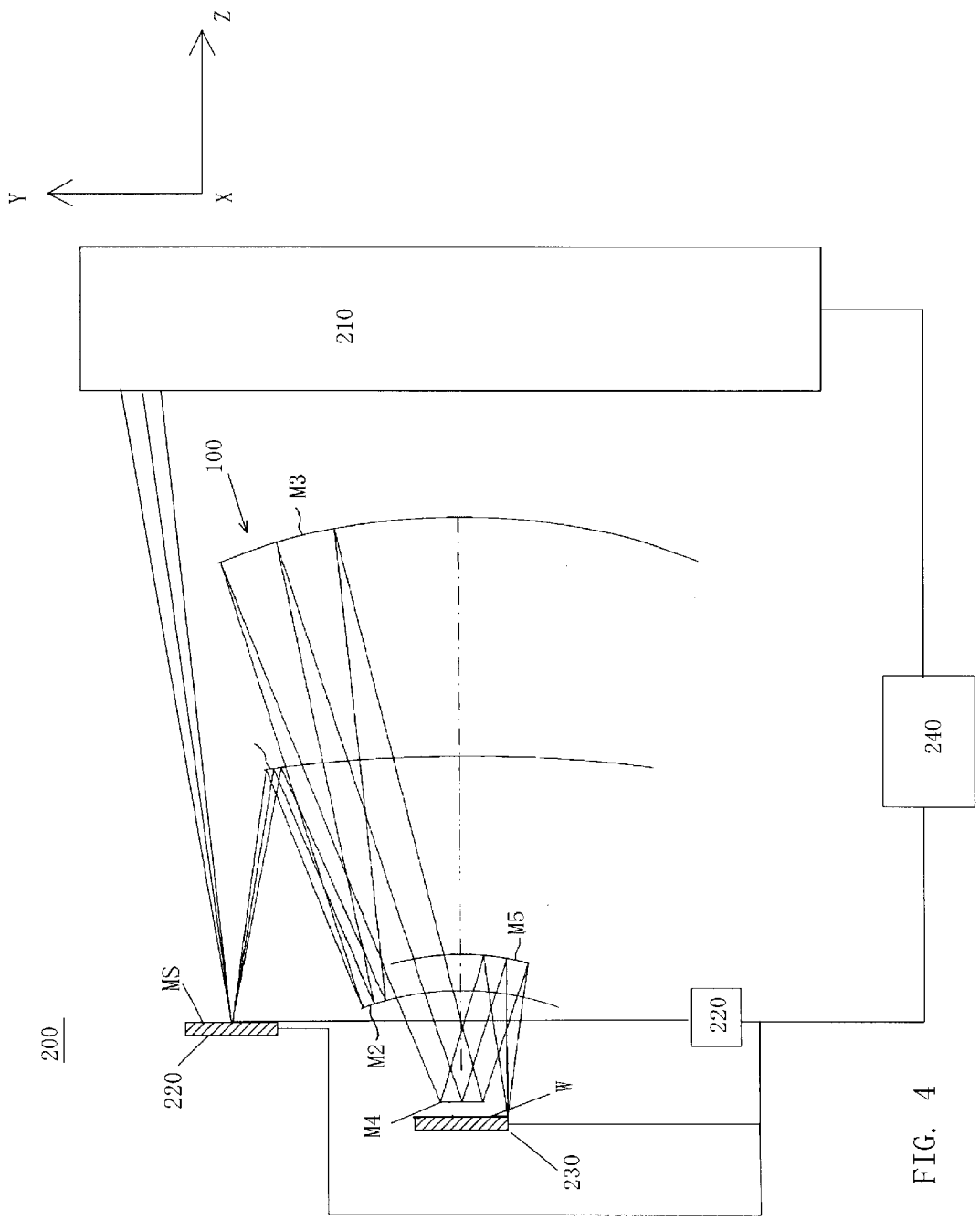
FIG. 4 is a schematic structural view of an exposure apparatus including the reflection type demagnification projection optical system shown in FIG. 1.

A description will now be given of a reflection type demagnification projection optical system 100 and an exposure apparatus 200 as one aspect of the present invention by referring to accompanying drawings. The same reference numeral in each figure denotes the same element. Here, FIG. 1 is a schematic sectional view showing the reflection type demagnification projection optical system 100 as one aspect of the present invention, and its optical path. FIGS. 2 and 3 are schematic sectional views showing reflection type demagnification projection optical systems 100a and 100b as variations of the reflection type demagnification projection optical system 100 shown in FIG. 1, and its optical path. FIG. 4 is a schematic structural view showing an exposure apparatus including the reflection type demagnification projection optical system 100 shown in FIG. 1. Hereinafter, unless otherwise specified, the reflection type demagnification projection optical system 100 generalizes the reflection type demagnification projection optical systems 100a and 100b.

The reflection type demagnification projection optical system 100 is an optical system that demagnifies and projects a pattern on an object MS plane (for example, on a mask plane) onto an image W plane (for example, on a plane of an object to be exposed such as a plate), and includes five mirrors M1~M5. More specifically, as shown in FIGS. 1~3, the reflection type demagnification projection optical system 100 includes, in order of reflecting light from the object plane R side, a (concave) mirror M1, a (convex) mirror M2, a (concave) mirror M3, a (convex) mirror M4, and a (concave) mirror M5. Preferably, in the reflection type demagnification projection optical system 100, five mirrors M1~M5 are axially symmetrical relative to the common optical axis to maintain a large ring-shaped image plane area as described later. However, when the size of an image plane is comparatively small, the mirrors may be axially decentered, and aberrations may be corrected. Further, the five mirrors M1~M5 have the sum of the Petzval terms being zero or in the neighborhood of zero in order to flatten the image plane of the optical system. In other words, the sum of refractive power of these five mirrors M1~M5 is zero or in the neighborhood of zero. In order to meet each of the above conditions, and correct respective aberrations satisfactorily, the center of curvature for each of the mirrors M1~M5 of the instant embodiment is on the same side of each surface: If the optical system's design data is shown, all the signs of the radius of curvature for the five mirrors will be found to be the same signs.

As mentioned above, the object plane R and the image plane W are often located on the same side of the optical system in a five-mirror system, and thus, if such a reflection type demagnification projection optical system 100 is incorporated into an EUV lithography system, two stages for the mask and wafer of the exposure apparatus will cause a mechanical interference. Accordingly, it is required that the reflection type demagnification projection optical system adapt the five mirrors such that the object height and the image height are kept widely away from the optical axis. However, generally speaking, it is difficult to realize such a high object height (image height). The present inventors have eagerly investigated into this problem, and finally found out a way to achieve a large object height (image height) by constructing the five mirrors M1~M5 using an aspheric mirror with a comparatively large radius of curvature.

In this embodiment, at least one mirror out of the five mirrors M1~M5 in the reflection type magnification projection optical system has an aspheric mirror surface, and the shape of the aspheric surface can be given by using the following equation that expresses a general aspheric surface.

$$Z = \frac{ch^2}{1 + \sqrt{1 - (1+k)c^2k^2}} + Ah^4 + Bh^6 + Ch^8 + Dh^{10} + Eh^{12} + Fh^{14} + Gh^{16} + \ldots \quad (3)$$

Here, Z is a coordinate of the optical axis direction, c a curvature (a reciprocal number of the radius of curvature), h a height from the optical axis, k a conic constant, A, B, C, D, E, F, G, . . . $4^{th}$ order, $6^{th}$ order, $8^{th}$ order, $10^{th}$ order, $12^{th}$ order, $14^{th}$ order, $16^{th}$ order . . . aspheric coefficients, respectively.

Thereby, this embodiment may keep the object height more than 120 mm away from the optical axis, and the image height more than 30 mm away from the optical axis, and ideally speaking, this has made it possible to keep it 400 mm~1500 mm away in a direction where the object height and the image height intersect the optical axis orthogonally.

As shown in FIGS. 1~3, since the reflection type demagnification projection optical system 100 of the present embodiment does not form any intermediate image en route in the mirrors M1~M5, convergence and divergence of a ray of light become loose. As a result, good aberration correction is feasible even for the comparatively short total length. Therefore, it follows that the object point and the image point are on opposite sides with the axis between.

The fourth (convex) mirror M4 is located at an aperture stop, and adequately set position and shape of the fifth mirror (concave mirror) M5 relative to the fourth mirror M4 may form the telecentric optical system at the image side. Further, the object side is not made telecentric to advantage when a reflection type mask is used. Moreover, both the object plane and the image plane are located on the same side of the optical system, and the two are oriented in the same direction. Namely, both the object plane and the image plane are arranged, e.g., as if opposed to the third (concave) mirror M3.

A description will now be given of a result of illumination test by using the demagnification projection optical systems 100–100b. In FIGS. 1~3, MS denotes a reflection type mask located at the position of the object plane, and W denotes a wafer located at the position of the image plane. In the reflection type demagnification projection optical systems 100–100b, the reflection type mask MS is illuminated by an illumination system (not shown) that emits an EUV ray with a wavelength of 13.4 nm or so, and reflected light from the mask MS is in turn reflected by the $1^{st}$ (concave) mirror M1, $2^{nd}$ (convex) mirror M2, $3^{rd}$ (concave) mirror M3, $4^{th}$ (convex) mirror M4, and $5^{th}$ (concave) mirror M5 in this sequence, and a demagnified image of the mask pattern is formed on the wafer W located at the position of the image plane. Further, the reflection type demagnification projection optical systems 100~100b have NA=0.15, and magnification=⅕.

First, for the reflection type demagnification projection optical system 100 shown in FIG. 1, the object height is 780~800 mm, the image height is 156~160 mm, the radius of the image plane arc is about 158 mm, and its width is 4 mm. The numerical values (the radius of curvature, separations between planes, the coefficient of an aspheric surface, etc.) of the reflection type demagnification projection optical system 100 shown in FIG. 1 are shown in Table 1.

TABLE 1

| Wavelength = 13.4 nm Mirror No. | NA = 0.15 Radius of Curvature | Object Height = 780~800 mm Separation between planes | Magnification = 1/5 k | | |
|---|---|---|---|---|---|
| MS (Mask) | ∞ | 902.154193 | | | |
| M1 | −5915.34525 | −800.000000 | 13.698174 | | |
| M2 | −996.75482 | 1616.391833 | −0.598169 | | |
| M3 | −2431.74080 | −2000.000000 | 0.018346 | | |
| M4 | −1764.65336 | 503.406661 | 8.742637 | | |
| M5 | −1010.36328 | −552.846727 | 0.587487 | | |
| W | ∞ | | | | |
| Mirror | A | B | C | D | E |
| M1 | −0.980142E−12 | 0.505963E−17 | 0.0 | 0.0 | 0.0 |
| M2 | −0.939052E−10 | −0.273338E−16 | 0.0 | 0.0 | 0.0 |
| M3 | −0.963953E−14 | 0.492903E−20 | 0.0 | 0.0 | 0.0 |
| M4 | 0.415121E−11 | 0.961766E−17 | 0.0 | 0.0 | 0.0 |
| M5 | 0.146782E−10 | 0.959098E−17 | 0.0 | 0.0 | 0.0 |

Aberrations (calculated at several points of the image height) of the reflection type demagnification projection optical system 100, which do not include errors of manufacture, are wave aberration=0.017 λrms, and distortion aberration=±12 nm, and any one of these is an optical system that is diffraction limited at a wavelength of 13.4 nm.

Next, for the reflection type demagnification projection optical system 100a shown in FIG. 2, the object height is 780~800 mm, the image height is 156~160 mm, the radius of the image plane arc is about 158 mm, and its width is 4 mm. Here, the numerical values (the radius of curvature, separations between planes, the coefficient of an aspheric surface, etc.) of the reflection type demagnification projection optical system 100a shown in FIG. 2 are shown in Table 2.

TABLE 2

| Wavelength = 13.4 nm Mirror No. | NA = 0.15 Radius of Curvature | Object Height = 780 ~ 800 mm Separation between Planes | Magnification = 1/5 K | | |
|---|---|---|---|---|---|
| MS (Mask) | ∞ | 812.460531 | | | |
| M1 | −6646.13064 | −800.000000 | 11.292450 | | |
| M2 | −1159.40055 | 1499.999991 | −0.564088 | | |
| M3 | −2197.70160 | −1500.000000 | 0.015743 | | |
| M4 | −1367.81758 | 504.546735 | 5.898626 | | |
| M5 | −1011.45964 | −631.354886 | 0.511917 | | |
| W | ∞ | | | | |
| Mirror | A | B | C | D | E |
| M1 | −0.132134E−10 | 0.663588E−17 | −0.108358E−23 | 0.0 | 0.0 |
| M2 | −0.102102E−09 | −0.199735E−16 | 0.625040E−22 | 0.0 | 0.0 |
| M3 | −0.167970E−12 | 0.279002E−19 | 0.360034E−25 | 0.0 | 0.0 |
| M4 | 0.822575E−10 | 0.210395E−15 | −0.979779E−21 | 0.0 | 0.0 |
| M5 | 0.163089E−10 | 0.127582E−16 | −0.100926E−22 | 0.0 | 0.0 |

Aberrations (calculated at several points of the image height) of the reflection type demagnification projection optical system 100a, which do not include errors of manufacture, are wave aberration=0.025 λrms, and distortion aberration=±0.35 nm, and any one of these is an optical system that is diffraction limited at a wavelength of 13.4 nm.

Next, for the reflection type demagnification projection optical system 100b shown in FIG. 3, the object height is 790~800 mm, the image height is 158~160 mm, the radius of the image plane arc is about 159 mm, and its width is 2 mm. The numerical values (the radius of curvature, separations among planes, the coefficient of an aspheric surface, etc.) of the reflection type demagnification projection optical system 100b shown in FIG. 3 are shown in Table 3.

TABLE 3

| Wavelength = 13.4 nm Mirror No. | NA = 0.15 Radius of Curvature | Object Height = 780 ~ 800 mm Separation between Planes | | Magnification = 1/5 K |
|---|---|---|---|---|
| MS (Mask) | ∞ | 892.716243 | | |
| M1 | −15128.81072 | −504.276422 | | 20.560964 |
| M2 | −1230.82948 | 1399.999981 | | −0.412540 |
| M3 | −2134.61722 | −1399.987643 | | 0.022208 |
| M4 | −1359.14624 | 504.446119 | | 5.816247 |
| M5 | −1010.42052 | −657.774353 | | 0.464925 |
| W | ∞ | | | |

| Mirror | A | B | C | D | E |
|---|---|---|---|---|---|
| M1 | −0.591499E−10 | 0.464143E−16 | −0.237230E−22 | −0.143342E−23 | 0.867583E−35 |
| M2 | −0.115767E−09 | 0.366580E−16 | 0.186354E−21 | −0.397996E−27 | 0.158233E−32 |
| M3 | 0.423848E−12 | 0.356753E−18 | 0.343298E−24 | −0.242807E−30 | 0.262909E−36 |
| M4 | 0.103502E−09 | 0.258991E−15 | 0.157972E−19 | −0.312875E−23 | 0.243282E−27 |
| M5 | 0.188008E−10 | 0.119997E−16 | 0.810951E−22 | −0.639612E−27 | 0.272830E−32 |

Aberrations (calculated at several points of the image height) of the reflection type demagnification projection optical system 100b, which do not include errors of manufacture, are wave aberration=0.054 λrms, and distortion aberration=±7.6 nm, and any one of these is an optical system that is diffraction limited at a wavelength of 13.4 nm.

The magnification of the above reflection type demagnification projection optical systems 100~100b is, paraxially speaking, ⅕, but the magnification in the aberration correction area is a value slightly deviated from the perfect ⅕. However, by shifting the paraxial magnification slightly from the ⅕, it can readily be attained to make the magnification in the aberration correction area to be perfectly ⅕. Moreover, the present invention can further improve performance within its scope without being restricted by these examples. As described above, the present invention has realized a high object height and image height, thus achieving a reflection optical system that can attain diffraction limited performance by using an EUV wavelength. From the above description, it will be understood that it is possible to prevent mechanical interference of both stages even in applying the reflection type demagnification projection optical system 100 of the present invention to an EUV lithography system.

A description will be given below of an exposure apparatus 200 to which the reflection type demagnification projection optical system of the present invention is applied. The exposure apparatus 200 according to the present invention is a projection exposure apparatus that uses, as illumination light, an EUV ray (e.g., with a wavelength of 13.4 nm) to perform step-and-scan type exposure operations. To reference FIG. 4, the exposure apparatus 200 includes an illumination apparatus 210, a mask MS, the reflection type demagnification projection optical system 100, an object to be exposed W, and a controller 240, and the controller 240 is connected so that it can control the illumination apparatus 210. Also, the exposure apparatus according to the present embodiment additionally includes a mask stage 220 on which to place the mask MS, and a wafer stage 230 on which to place the object W, and the mask stage 220 and the wafer stage 230 are connected to the controller 240 so as to be controlled by it. Although not shown in FIG. 4, since the EUV ray has low transmittance in relation to the air, it is preferable that the optical path where at least the EUV passes through has a vacuum atmosphere. In FIG. 4, however, X, Y, and Z denote a three-dimensional space, and a normal direction of an Z-Y plane is made to be X direction.

The illumination apparatus 210 is an illumination apparatus that uses an arc-shaped EUV ray (e.g., with a wavelength of 13.5 nm) corresponding to an arc-shaped field of the reflection type demagnification projection optical system 100 to illuminate the mask MS, and is comprised of a light source (not shown) and an illumination optical system. Furthermore, any known technique can be applied to the light source and the illumination apparatus that composes the illumination apparatus 210, and thus, a detailed explanation will be omitted in the present specification. For example, the illumination optical system includes a condensing optical system, an optical integrator, an aperture stop, a blade, etc., and any techniques that those skilled in the art can deliver are applicable.

The mask MS is a reflection type mask, on which a circuit pattern (or an image) to be transferred is formed and which is supported and driven by the mask stage 220. Incidentally, since the object side of the reflection type demagnification projection optical system 100 according to the present embodiment is not telecentric, the mask MS may be a reflection type mask. Reflected and diffracted light emitted from the mask MS is reflected on the projection optical system 100, and projected onto the object W. The mask MS and the plate W are disposed in an optically conjugate relationship. Since the exposure apparatus 200 of the present embodiment is a step-and-scan type exposure apparatus, a scan of the mask MS and the object W transfers the pattern on the mask MS onto the object W.

The mask stage 220 supports the mask MS, and is connected to a transport mechanism (not shown). Any structure known in this art is applicable for the mask stage 220. The transport mechanism (not shown) can be composed by a linear motor, and can move the mask MS by driving the mask stage 220 at least in Y direction under the control of the controller 240. The exposure apparatus 200 scans the mask MS and the object W in a state synchronized by the controller 240.

The reflection type demagnification projection optical system 100 is a reflection type optical system that demagnifies and projects the pattern on the mask MS onto the image plane. Any structures as described above can be applied to the reflection type demagnification projection optical system 100, and thus, a detailed description is omitted here. Further, in FIG. 4, the reflection type demagnification projection optical system 100 shown in FIG. 1 is used, but such a structure is exemplary, and thus, the present invention is not limited to this.

In the present embodiment, the object W is a wafer, but it may widely include a liquid crystal plate, and other objects. Photo-resist is applied onto the object W. A photo-resist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo-resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The wafer stage 230 supports the object W. The stage 230 may use any structure known in the art, and thus, a detailed description of its structure and operations is omitted here. For example, the stage 230 uses a linear motor to move the object W in X-Y-Z directions. The mask MS and object W are scanned synchronously under the control of the controller 240, and the positions of the mask stage 220 and wafer stage 230 (not shown) are monitored, for example, by a laser interferometer and the like, so that both are driven at a constant speed ratio.

The controller 240 (not shown) includes a CPU and a memory, and controls the operations of the exposure apparatus 200. The controller 240 is electrically connected with the illumination apparatus 210, the mask stage 220 (namely, the transport mechanism (not shown) of the mask stage 220), and the wafer stage 230 (namely, the transport mechanism (not shown) of the wafer stage 230). The CPU includes any kinds of processors regardless of whatever names may be such as MPS, thus controlling the operation of each part. The memory is composed of ROMs and RAMs, which store firmware to operate the exposure apparatus 210.

At the time of exposure, an EUV ray emitted from the illumination apparatus 210 illuminates the mask MS, and forms a pattern image on the mask MS onto the plane of the object W. In the present embodiment, the image plane is an arc-shaped (ring-shaped) image plane, and the whole area of the mask can be exposed by scanning the mask and wafer at the speed ratio of the demagnification ratio. The image height of the reflection type demagnification projection optical system 100 of the present invention is large. For example, in FIGS. 1 and 2, the image height=156~160 mm. In this case, the radius of the circular arc on the image plane is about 158 mm with a width of 4 mm. Thus, the reflection type demagnification projection optical system 100 of the present invention has degrees of freedom in terms of an image plane selection.

Figure 5A:
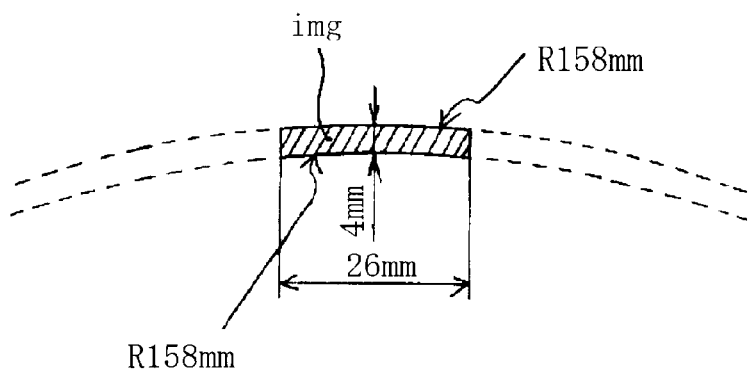
FIG. 5 is a view showing an example way of taking an image plane based on an image height of the reflection type demagnification projection optical system shown in FIGS. 1 and 2.
Figure 5B:
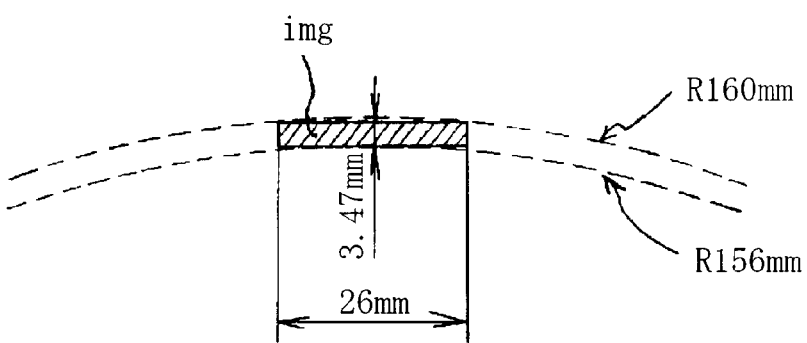
Figure 6:
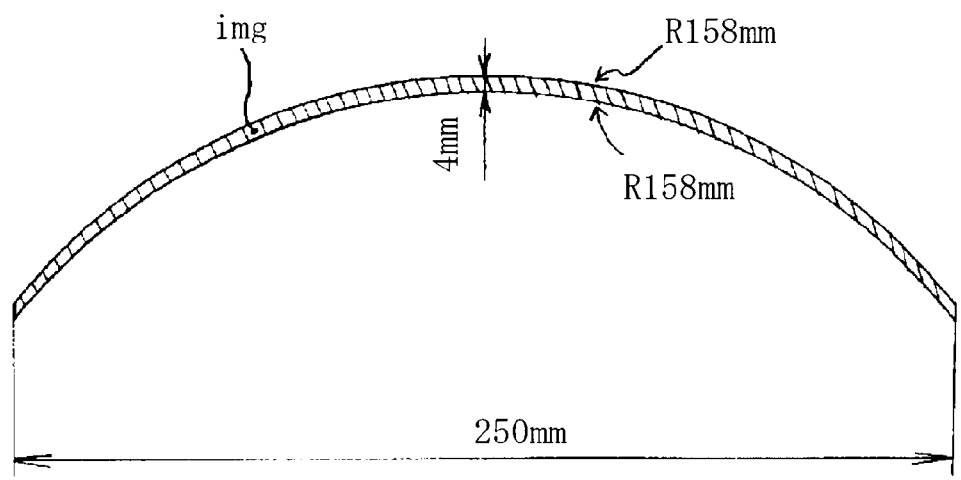
FIG. 6 is a view showing an example way of taking an image plane based on an image height of the reflection type demagnification projection optical system shown in FIGS. 1 and 2.

FIGS. 5 and 6 are drawings showing an example of how to select an image plane based on the image heights of the reflection type demagnification projection optical systems 100 and 100a. A good image plane area in the present embodiment is anywhere outside the circle with a radius of 156 mm, and inside the circle, with a radius of 160 mm, having the same center of curvature. However, the width of an exposure ray in a scanning direction needs to be uniform for the most part of the exposure area, and an exposure intensity after the scan needs to be almost constant at each place.

FIG. 5 is where the size of the image plane in the direction orthogonal to the scan is 26 mm, and it is likely that such a size as this is normal to the EUV exposure.

FIG. 5A is where the radius of curvature for both the upper boundary and bottom boundary parts of the exposure area is determined to be 158 mm, and a width of a ring-shaped exposure area is set to 4 mm. A symbol img indicates an exposure area of an optical system to be used. If a ring-shaped exposure area is used as in this example, the width of the exposure area in a scanning direction can be made maximum (4 mm in this example).

On the other hand, FIG. 5B is where a rectangular exposure area is used. Since the radii of curvature of both ring-shaped exposure areas are large, the exposure width in the scanning direction does not have to become small even if the rectangular exposure area is set. This preferred embodiment can secure a rectangular exposure area of 26 mm×3.47 mm, and so, can accomplish the rectangular exposure area just by reducing the width in the scanning direction by 0.5 mm compared to the ring-shaped exposure area. Since a rectangular exposure area is common in a scan-type exposure apparatus using an excimer laser lens, it is likely that a rectangular exposure area, if possible, would increase reliability of an apparatus.

FIG. 6 shows an example that utilizes a big size of an image height in the reflection type demagnification projection optical system 100 to the utmost to make possible an exposure operation in a very large area. Both the upper boundary and bottom boundary parts of the exposure area have a radius of curvature of 158 mm. Further, the fact that the width of the ring-shaped exposure area is determined to be 4 mm is due to the same reason as FIG. 5A, but the size of the image plane in the direction orthogonal to the scan is made to be 250 mm, which is one digit bigger. By using the reflection type demagnification projection optical system 100, there is a possibility that such a large image plane can theoretically be scanned and exposed.

Figure 7:
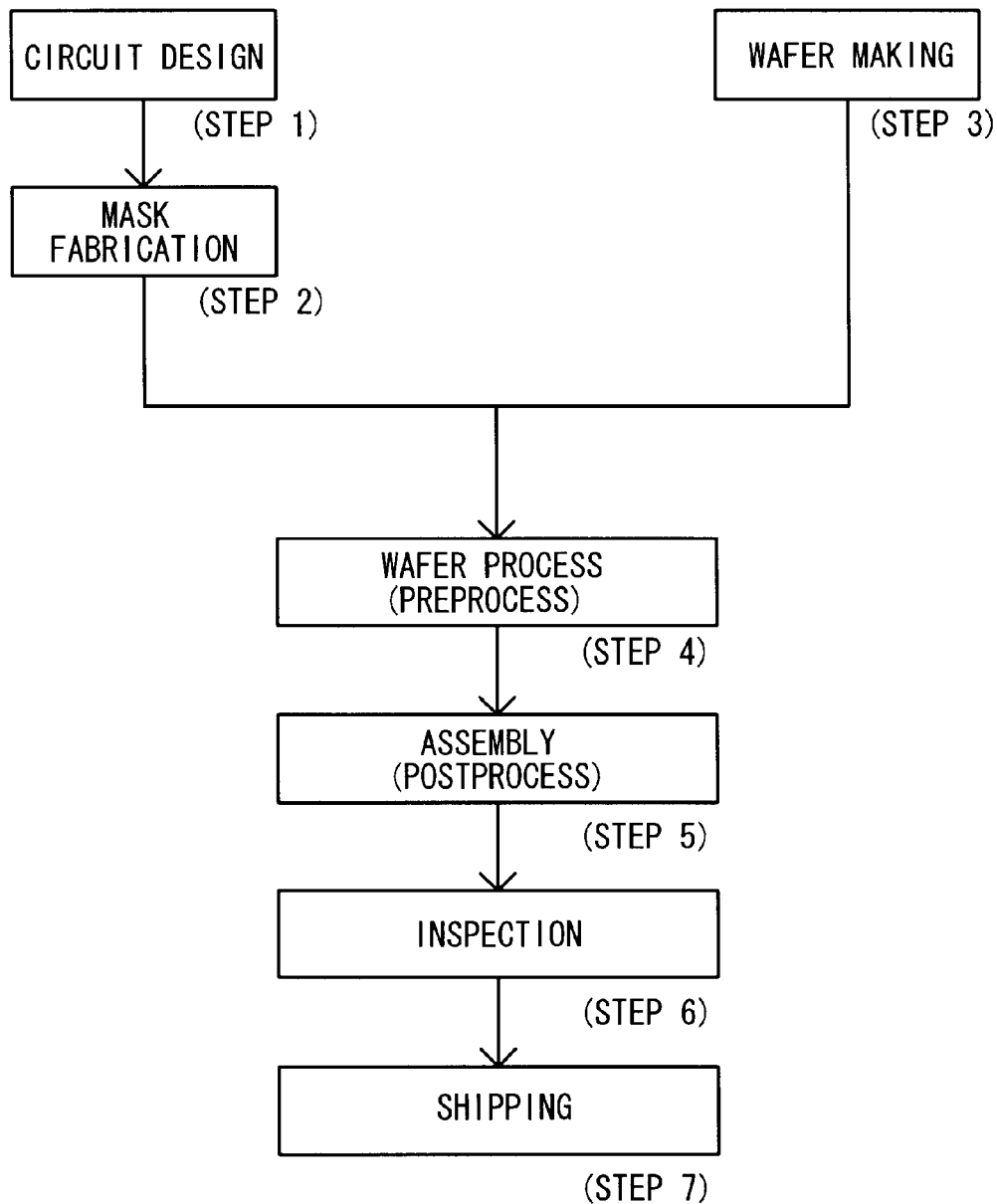
FIG. 7 is a flowchart for explaining how to fabricate devices (such as semiconductor chips such as ICs and LSIs, LCDs, CCDs, and the like).
Figure 8:
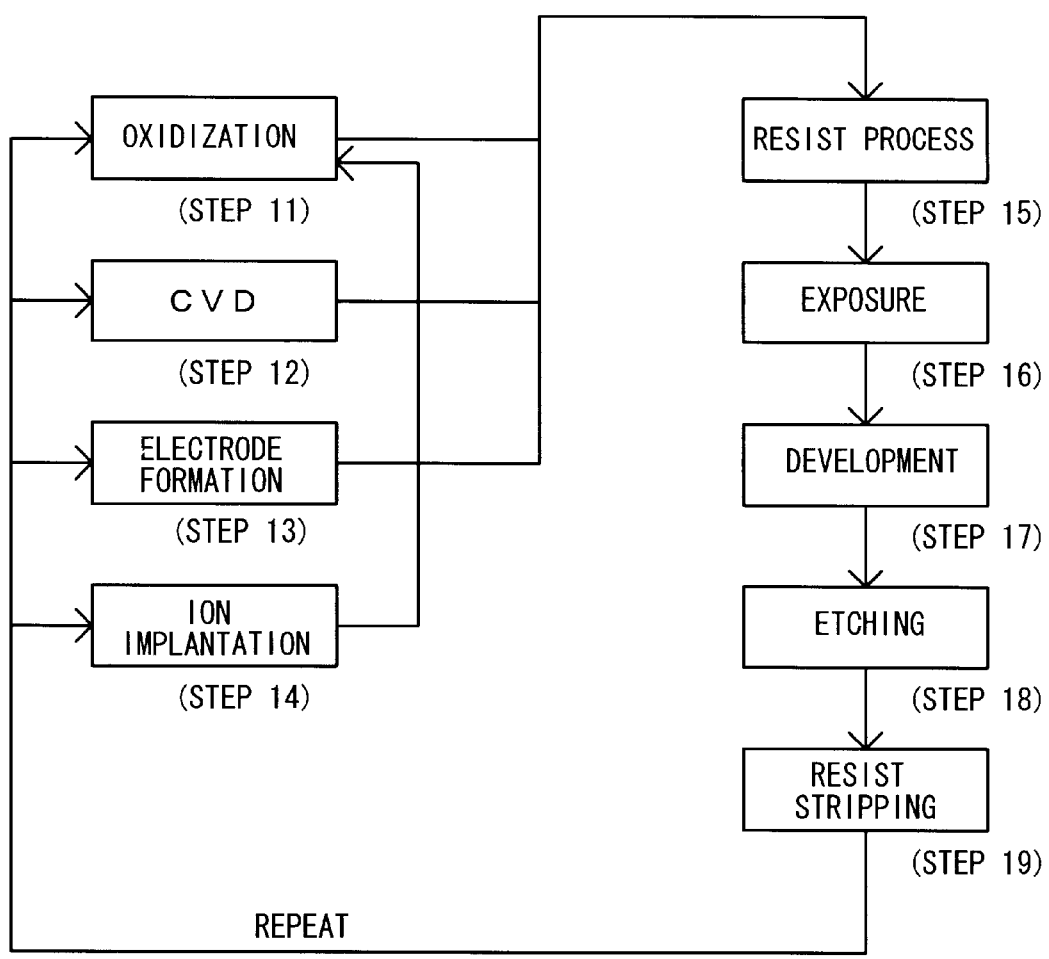
FIG. 8 is a flowchart for step 4 that is a wafer process shown in FIG. 7.

Referring to FIGS. 7 and 8, a description will now be given of an embodiment of a device fabrication method using the above mentioned exposure apparatus 200. FIG. 7 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The fabrication method of the instant embodiment may manufacture higher quality devices than the prior art. In this manner, the device fabrication method that uses such an exposure apparatus 200 and the device as a final product serve as other aspects according to the present invention.

The present invention is not limited to these preferred embodiments, and various variations and modifications may be made without departing from the spirit and scope of the present invention. Further, this invention can be applied to a reflection type demagnification projection optical system for non-EUV ultraviolet rays such as i-line and excimer laser, as well as to an exposure apparatus that scans and exposes large image planes.

According to the reflection type demagnification projection optical system and exposure apparatus of the present invention, a five-mirror system can be realized, the five-mirror system that increases resolving power more than a four-mirror system and increases throughput more than a six-mirror system, i.e., better balanced in terms of resolving power and throughput. Furthermore, since the reflection type demagnification projection optical system can realize a large object height and image height, it can prevent the mask stage and wafer stage from interfering with each other, thus providing high quality devices with good exposure performances such as throughput.

What is claimed is:

1. An reflection type demagnification projection optical system comprising:

five mirrors including, in order from an object side to an image side, a concave mirror (M1), a convex mirror (M2), a concave mirror (M3), a convex mirror (M4), and a concave mirror (M5), said five mirrors basically forming a coaxial system, and forming no intermediate image, and wherein an object point and an image point are respectively on opposite sides across an optical axis, and are kept 400~1500 mm apart with respect to a direction orthogonal to the optical axis.

2. A reflection type demagnification projection optical system according to claim 1, wherein at least one mirror out of said five mirrors is an aspheric mirror.

3. A reflection type demagnification projection optical system according to claim 1, wherein the fourth convex mirror (M4) among said five mirrors is located at an aperture stop.

4. A reflection type demagnification projection optical system according to claim 1, wherein said five mirrors are multilayer film mirrors that reflect EUV light.

5. A reflection type demagnification projection optical system according to claim 1, wherein the EUV light has a wavelength of 20 nm or less.

6. A reflection type demagnification projection optical system according to claim 1, wherein a reflection type mask is disposed on the object side.

7. An exposure apparatus comprising:

a reflection type demagnification projection optical system comprising five mirrors including, in order from an object side to an image side, a concave mirror (M1), a convex mirror (M2), a concave mirror (M3), a convex mirror (M4), and a concave mirror (M5), said five mirrors basically forming a coaxial system, and forming no intermediate image, and wherein an object point and an image point are respectively on opposite side across an optical axis, and kept 400~1500 mm apart with respect to a direction orthogonal to the optical axis;

a first stage for holding a mask so that a pattern on the mask may be located on the object side;

a second stage for holding a plate so that a photosensitive layer may be located on the image side;

an illumination system that uses arc-shaped EUV light corresponding to an arc-shaped field of said projection optical system, to illuminate the mask; and a mechanism that synchronously scans each of said first and second stages while using the EUV light to illuminate the mask.

8. A device fabricating method comprising the steps of:

projecting and exposing a plate by using an exposure apparatus comprising a reflection type demagnification projection optical system comprising five mirrors including in order from an object side to an image side, a concave mirror (M1), a convex mirror (M2), a concave mirror (M3), a convex mirror (M4), and a concave mirror (M5), said five mirrors basically forming a coaxial system, and forming no intermediate image, and wherein an object point and an image point are respectively on opposite side across an optical axis, and kept 400~1500 mm apart with respect to a direction orthogonal to the optical axis, a first stage for holding a mask so that a pattern on the mask may be located on the object side, a second stage for holding a plate so that a photosensitive layer may be located on the image side, an illumination system that uses arc-shaped EUV light corresponding to an arc-shaped field of said projection optical system, to illuminate the mask, and a mechanism that synchronously scans each of said first and second stages while using the EUV light to illuminate the mask; and performing a specific process for the plate projected and exposed.

\* \* \* \* \*